(12) United States Patent
Gopal et al.

(10) Patent No.: US 9,203,887 B2
(45) Date of Patent: Dec. 1, 2015

(54) BITSTREAM PROCESSING USING COALESCED BUFFERS AND DELAYED MATCHING AND ENHANCED MEMORY WRITES

(75) Inventors: Vinodh Gopal, Westborough, MA (US); Jim D. Guilford, Northborough, MA (US); Gilbert M. Wolrich, Framingham, MA (US); Wajdi K. Feghali, Boston, MA (US); Deniz Karakoyunlu, Worcester, MA (US); Erdinc Ozturk, Marlborough, MA (US); Martin Dixon, Portland, OR (US); Kahraman Akdemir, Franklin, MA (US)

(73) Assignee: Intel Corporation, Santa Clara, CA (US)

( * ) Notice: Subject to any disclaimer, the term of this patent is extended or adjusted under 35 U.S.C. 154(b) by 343 days.

(21) Appl. No.: 13/994,129

(22) PCT Filed: Dec. 23, 2011

(86) PCT No.: PCT/US2011/067092
§ 371 (c)(1),
(2), (4) Date: Jun. 14, 2013

(87) PCT Pub. No.: WO2013/095615
PCT Pub. Date: Jun. 27, 2013

(65) Prior Publication Data
US 2014/0156790 A1    Jun. 5, 2014

(51) Int. Cl.
*H04L 29/06* (2006.01)
*H04W 28/06* (2009.01)
*H03M 7/30* (2006.01)

(52) U.S. Cl.
CPC ........... *H04L 65/607* (2013.01); *H03M 7/3086* (2013.01); *H03M 7/30* (2013.01); *H04L 65/608* (2013.01); *H04L 69/04* (2013.01); *H04L 69/22* (2013.01); *H04W 28/06* (2013.01)

(58) Field of Classification Search
CPC .................................................. H04L 65/607
USPC .......................... 370/231, 236, 356, 472, 477
See application file for complete search history.

(56) References Cited

U.S. PATENT DOCUMENTS 5,493,689 A    2/1996  Waclawsky et al.
5,612,693 A *  3/1997  Craft et al. ...................... 341/51
(Continued)

FOREIGN PATENT DOCUMENTS

WO    2013/095615 A1    6/2013

OTHER PUBLICATIONS

International Preliminary Report on Patentability and Written Opinion received for PCT Patent Application No. PCT/US2011/067092, mailed on Jul. 3, 2014, 5 pages.
(Continued)

*Primary Examiner* — Andrew Lai
*Assistant Examiner* — Andrew C Lee
(74) *Attorney, Agent, or Firm* — Nicholson De Vos Webster & Elliot LLP

(57) ABSTRACT

Methods and apparatus for processing bitstreams and byte streams. According to one aspect, bitstream data is compressed using coalesced string match tokens with delayed matching. A matcher is employed to perform search string match operations using a shortened maximum string length search criteria, resulting in generation of a token stream having <len, distance> data and literal data. A distance match operation is performed on sequentially adjacent tokens to determine if they contain the same distance data. If they do, the len values of the tokens are added through use of a coalesce buffer. Upon detection of a distance non-match, a final coalesced length of a matching string is calculated and output along with the prior matching distance as a coalesced token. Also disclosed is a scheme for writing variable-length tokens into a bitstream under which token data is input into a bit accumulator and written to memory (or cache to be subsequently written to memory) as each token is processed in a manner that eliminates branch mispredict operations associated with detecting whether the bit accumulator is full or close to full.

18 Claims, 6 Drawing Sheets

(56) References Cited

U.S. PATENT DOCUMENTS

| | | | |
|---|---|---|---|
| 5,903,282 A | | 5/1999 | Schoner et al. |
| 6,070,003 A | | 5/2000 | Gove et al. |
| 7,719,978 B2 * | 5/2010 | Taubman et al. | 370/231 |
| 8,872,677 B2 * | 10/2014 | Litvak et al. | 341/51 |
| 2001/0038642 A1 * | 11/2001 | Alvarez et al. | 370/477 |
| 2002/0057716 A1 * | 5/2002 | Svanbro et al. | 370/477 |
| 2004/0170175 A1 * | 9/2004 | Frank et al. | 370/392 |
| 2005/0104753 A1 | 5/2005 | Dror et al. | |

OTHER PUBLICATIONS

International Search Report and Written Opinion received for PCT Application No. PCT/US2011/067092, mailed on Sep. 27, 2012, 8 pages.

* cited by examiner

US 9,203,887 B2

BITSTREAM PROCESSING USING COALESCED BUFFERS AND DELAYED MATCHING AND ENHANCED MEMORY WRITES

FIELD OF THE INVENTION

The field of invention relates generally to bitstream and byte stream processing and, more specifically but not exclusively relates to technique for improved writing, compression, and decompression of bitstreams.

BACKGROUND INFORMATION

The amount of data that is transferred via the Internet is staggering. Recent estimates project that there will soon be more than one trillion web pages, and that more than half of the world's population has access to the Internet. At the same time, the capacity of commodity storage devices continues to increase while maintaining or even reducing their cost. For example, hard disc drives of 2 TB or even 3 TB can be purchased under $100. Meanwhile, because of the cheap cost of storage, there is often little motivation to implement space-efficient storage schemes for most types of data.

This creates a dichotomy. On the one hand, you have an ever increasing number of users with ever increasing access to storage. On the other hand, the increase in the number of users and their increased appetites for downloaded content results in bandwidth capacities that are constantly being pushed to their limits, leading Internet Service Providers to propose implementing tiered services, while users argue for "Net Neutrality." This problem is even more exacerbated for wireless access, as evidenced by more mobile carriers removing their limitless data plans in favor of tiered data plans.

Data content is transferred over the Internet in one of several packet-based transmission schemes, such as TCP/IP and UDP. This technique is commonly referred to as "streaming," but in reality the process involves partitioning a stream of bits (i.e., bitstream) comprising or otherwise derived from an original document, into a multitude of packets that are individually sent across the Internet and assembled and processed at the receiver to extract the same stream of bits. Furthermore, the processing may involve compression operations at the sender and decompression operations at the receiver. Upon completion of the processing, a copy of the original document is obtained.

In order to squeeze the most out of available transfer bandwidth, data content is often streamed in a compressed form. Some types of content are commonly stored in compressed formats based on well-established standards, such as music and video content. Other content, including HTML and general document content are generally not stored in compressed form. For example, the more recent versions of Microsoft Office products store document content in an XML-based format.

One technique for enhancing bandwidth is to perform on-the-fly compression at a sending entity and corresponding decompression at a receiving entity. Similar techniques may be used for real-time or batch archival purposes. In the case of document compression or archival, a "lossless" compression algorithm is typically used such that no data is lost when the compressed document content is decompressed. There are various lossless compression techniques employed for such purposes, including entropy encoding schemes such as Huffman coding, run-length encoding, and dictionary coders such as Lempel-Ziv (e.g., LZ77) and Lempel-Ziv-Welch (LZW).

One commonly used compression/decompression scheme is called DEFLATE, which is a variation on LZ that is uses a combination of the LZ77 algorithm and Huffman coding and is optimized for decompression speed and compression ratio, but involves computationally high compression costs. DEFLATE is used by popular compression tools such as PKZIP, which archives data in the ZIP format. DEFLATE is also used by GZIP compressed files and for PNG (Portable Network Graphics) images. In accordance with the use of HTTP Compression defined by RFC 2616, a web server may send and respond to HTTP content that is compressed with GZIP compression and decompressed using DEFLATE.

In view of the foregoing, it is projected that the use of lossless compression techniques in combination with content streaming will become ever more prevalent. Accordingly, it would be advantageous to provide enhanced generation and processing of bitstream content.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein like reference numerals refer to like parts throughout the various views unless otherwise specified.

DETAILED DESCRIPTION

Figure 1:
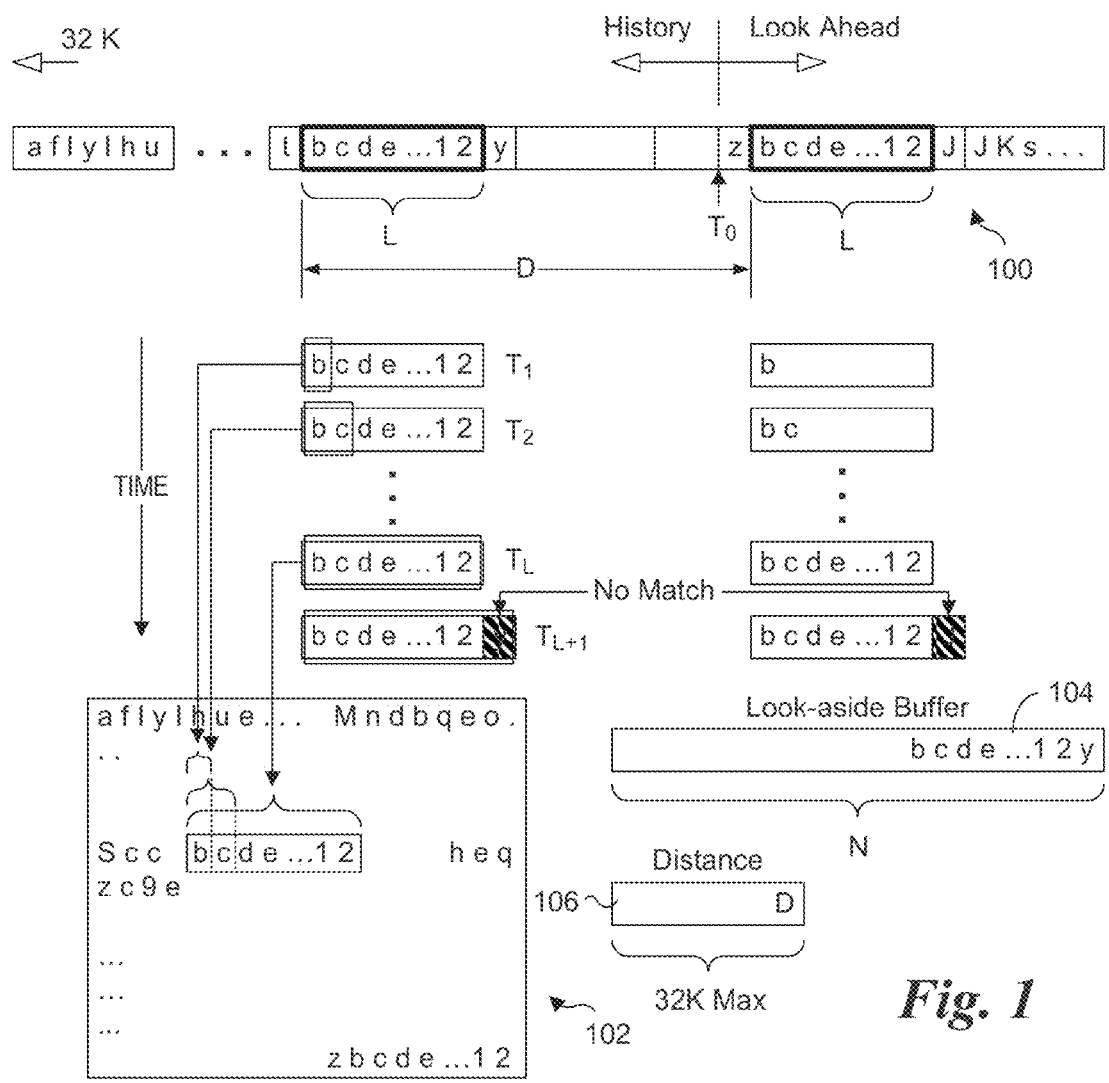
FIG. 1 is a schematic diagram illustrating a sliding window-based string match search scheme.

Embodiments of methods and apparatus for support enhanced bitstream generation and processing are described herein. In the following description, numerous specific details are set forth (such as use of the DEFLATE algorithm) to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In accordance with the teachings disclosed herein, a novel technique that accelerates Longest Prefix Matching (LPM) algorithms for a class of sequential data compression algorithms and lookup for IP/Routing applications is provided. The technique is implemented via an architecture that is very scalable and flexible to suit a variety of compression applications that are based on sliding-window algorithms and is amenable to a very efficient hardware implementation.

In an exemplary implementation illustrated herein, the LPM technique is applied to use with compression using the DEFLATE algorithm, which employs a sliding window matching scheme. However, this is not meant to be limiting, as the technique can generally be applied to other compression/decompression schemes in a similar manner. The DEFLATE algorithm encodes a bitstream comprising a sequence of blocks. Each block is preceded by a 3-bit header that identifies whether or not the block is the last block in the stream and the type of encoding method used for the block. Most blocks will end being encoded using dynamic Huffman encoding, while other blocks may store a literal or string between 0 and 65,535 bytes in length. Static Huffman encoding may also be used for some blocks.

Compression is achieved through two steps. In the first step comprises string matching and replacement of duplicate strings with pointers. The second step comprises replacing symbols with new, weighted symbols based on frequency of use. Within compressed blocks, if a duplicate series of bytes (a repeated string) is detected, then a back-reference is inserted, linking to the previous location of that identical string instead. An encoded match to an earlier string consists of a length L (3-258 bytes) and a distance D (1-32,768 bytes (32 KB)). Relative back-references can be made across any number of blocks, as long as the distance appears within the last 32 KB of uncompressed data decoded, which is referred to as the sliding window.

The various operations performed during DEFLATE compression and decompression are based on corresponding algorithms implemented via software. The algorithms are well-known, and there are numerous software implementations written in various languages. C programs typically use the zlib library. Similarly, Java includes support as part of the standard library (in java.util.zip).

FIG. 1 illustrates an example of a finding a match of length L in accordance with a sliding window match scheme. As bytes in a byte stream 100 are received, a match detection algorithm employing a sliding window is employed to determine whether there is an identical byte pattern that has been previously received and processed. The process stage shown in FIG. 1 corresponds to a state at which a prior portion of byte stream 100 has be received and processed, as illustrated by the History arrow and data in a lookup cache 102 in which the sliding window portion of the byte stream is temporally stored. Accordingly, once the lookup cache 102 is filled to the 32 KB limit, the content of lookup cache 102 incrementally changes with each cycle, removing the oldest character and adding the last character in byte stream 100 that was processed. For illustrative purposes, byte stream 100 is depicted as a stream of alphanumeric characters, rather than individual bits, which would be how the data would be encoded in an actual byte stream. Also for illustrative purposes, it is presumed that the alphanumeric characters are encoded as ASCII characters, such that each character is represented by 8 bits, or a single byte, thus the terminology "byte stream." Other 8-bit encodings could also be employed.

The arrow depicting time $T_0$ corresponds to the start of a processing cycle in which a byte corresponding to a character 'z' is evaluated for a match. From a conceptual view, a pattern match operation is performed evaluating character 'z' against previously received characters (bitmap patterns) in byte stream 100. In the case of DEFLATE, the size of the lookup cache is limited up to the previous 32K bytes of bitstream content. To evaluate the 'z' for a match, lookup cache 102 will be searched for a match (which in this case would be a single individual character 'z' that may have been previously received). In this particular example, a prior character 'z' has not been received such that there is no match. According, a literal 'z' will be forwarded for further processing, such as to an entropy coder.

Next, at a time $T_1$, a character 'b' is encountered. At time $T_1$ a search for character 'b' is commenced." In this case a prior 'b' has been received (within the 32 KB sliding window), and thus there is a match. In response to a match, further searching will be performed by adding one additional character (in byte stream 100) at a time to create incrementally longer search strings with evaluation continuing until a string match is not found. During a processing cycle beginning at time $T_2$, a second character 'c' is added to 'b' to create a search string 'b c', which is searched for in lookup cache 102. In one embodiment, a hashing scheme is implemented to facilitate string match searching. As before, a match is found, and the process is repeated again multiple times until we reach a cycle corresponding to time $T_L$. At this point, the search string 'b c d e . . . 1 2' is searched for a match. Since this same string has been previously retrieved, a match is found.

In conjunction with the foregoing string search evaluation sequence, for every added character to the string search window the corresponding character is added to a look-aside buffer 104 such that the string in the look-aside buffer at a given point in time matches the current search string window. Also, for each match result, data in a distance register 106 is updated to indicating the distance in bytes to the nearest match.

At a time $T_{L+1}$ a character 'J' is encountered, such that the match string is now 'b c d e . . . 1 2 J'. Meanwhile the next character in the prior match string is 'y' (and it is presumed that no other strings 'b c d e . . . 1 2 J' where previously received within the 32K sliding window. As a result, there is a miss. At this point, data indicating the length of the longest matched string in look-aside buffer 104 corresponding to the prior match (which can be obtained by removing the last added character) and data in the distance register 106 identifying the distance to the matched string is encoded as a token comprising a <len, distance> pair.

Figure 2:
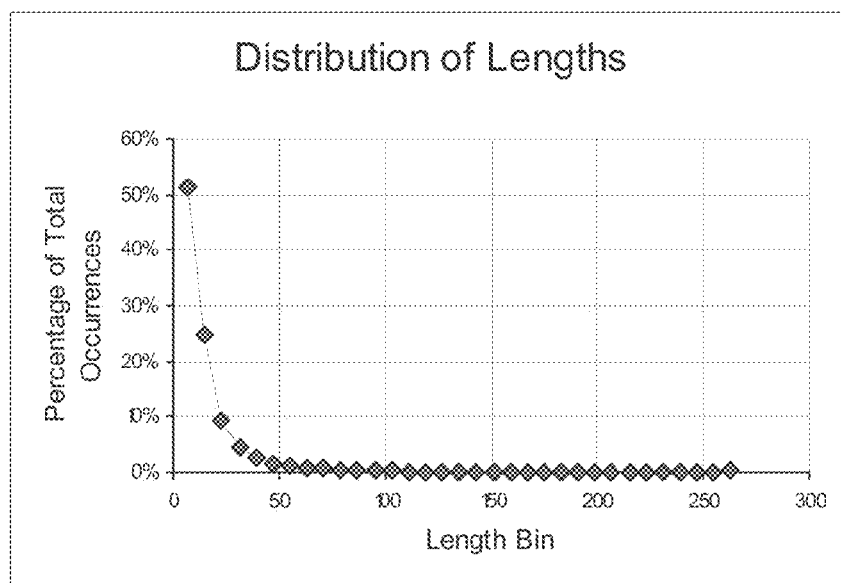
FIG. 2 is a graph depicted a distribution of matched string lengths vs. percentage of occurrences.

Under DEFLATE there can be a matching string length of up to 258 bytes. Under a conventional approach, a hardware look-aside buffer of at least 258 bytes would be used to ensure that any match of 258 bytes or less (that is, any legal DEFLATE string match) could be buffered. However, the frequency of encountering a string match of 258 bytes is extremely small. Moreover, the frequency of finding string matches based on length can be approximated as an inverse exponential equation under which the frequency falls off rapidly as the bit length increases. For example, the graph 200 in FIG. 2 is illustrative of the distribution of matching lengths as a percentage of occurrences one might find for a large corpus of files obtained, for example, from the top 500 web sites.

In view of the graph 200, there is a good tradeoff point for lengths in the range of 8-24 bytes, where the curve drops off steeply, which collectively represent close to 90% of the matches statistically found. Therefore it is attractive to consider a smaller hardware look-aside buffer, such as a buffer of size 24 bytes or less. For example, consider a look-aside buffer of 16 bytes. This would limit the front-end of the LPM machine to finding matches that are at most 16 bytes in length.

A small buffer of this size can be implemented to still support matches up to 256 bits by employing a back-end coalesce buffer that holds (or otherwise equivalently implements) some number of <len, distance> encodings and delays sending these to the entropy (e.g., Huffman) coder block until they can be merged and combined into as large as matches as possible. For instance, suppose we have a repeating substring of length 32 that appears at a relative distance of 100; the front-end matcher would first find <len=16, d=100> and then move ahead 16 literals and initiate the LPM search again at this current position. However, this will find the second 16 byte match at a relative distance of 100, and the LPM front-end will emit the second pair as <len=16, d=100>. If a coalesce unit or equivalent coalescing functionality is not employed, these LPM results would be encoded as two separate symbols, thereby losing some compression ratio. However, in accordance with aspects of teachings disclosed herein, a coalesce buffer is employed to effectively "hold on" to the first entry and combine it with the second to create a new <len=32, d=100> entry. Note that this delayed matching continues in the hope that there will be a third overlapping match that can increase the length of this match. If at some point, a literal or a match at a different offset (i.e., not @ 100) is received, then the previous match in the coalesce buffer is retired and a coalesced token is generated and forwarded on to the entropy coder for further processing.

Figure 3:
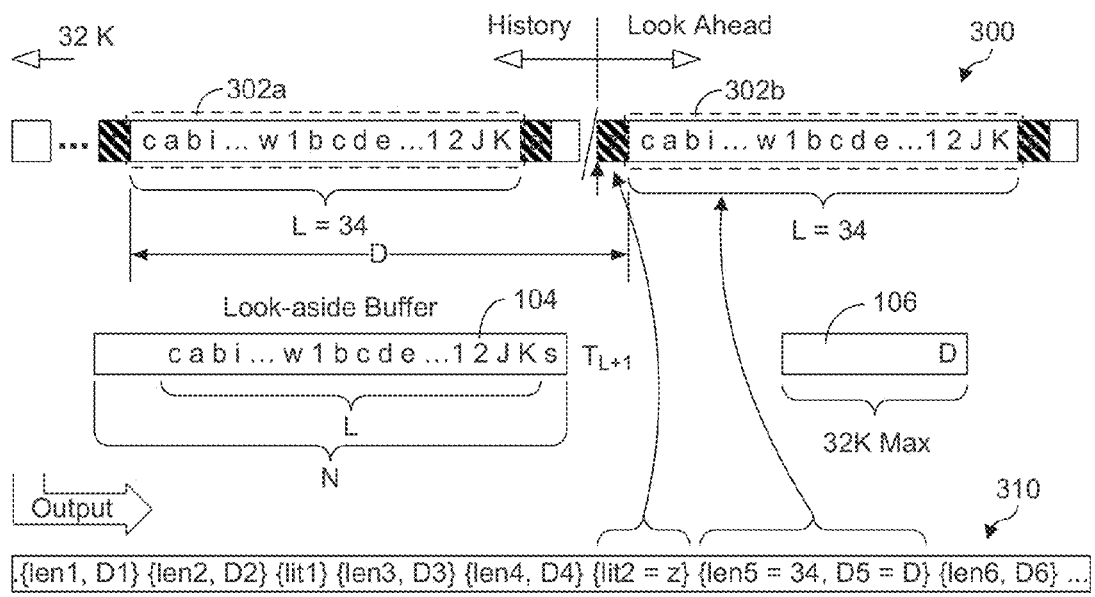
FIG. 3 is a schematic diagram illustrating use of an LPM front-end matcher employing conventional look-aside buffer width and distance register.
Figure 4:
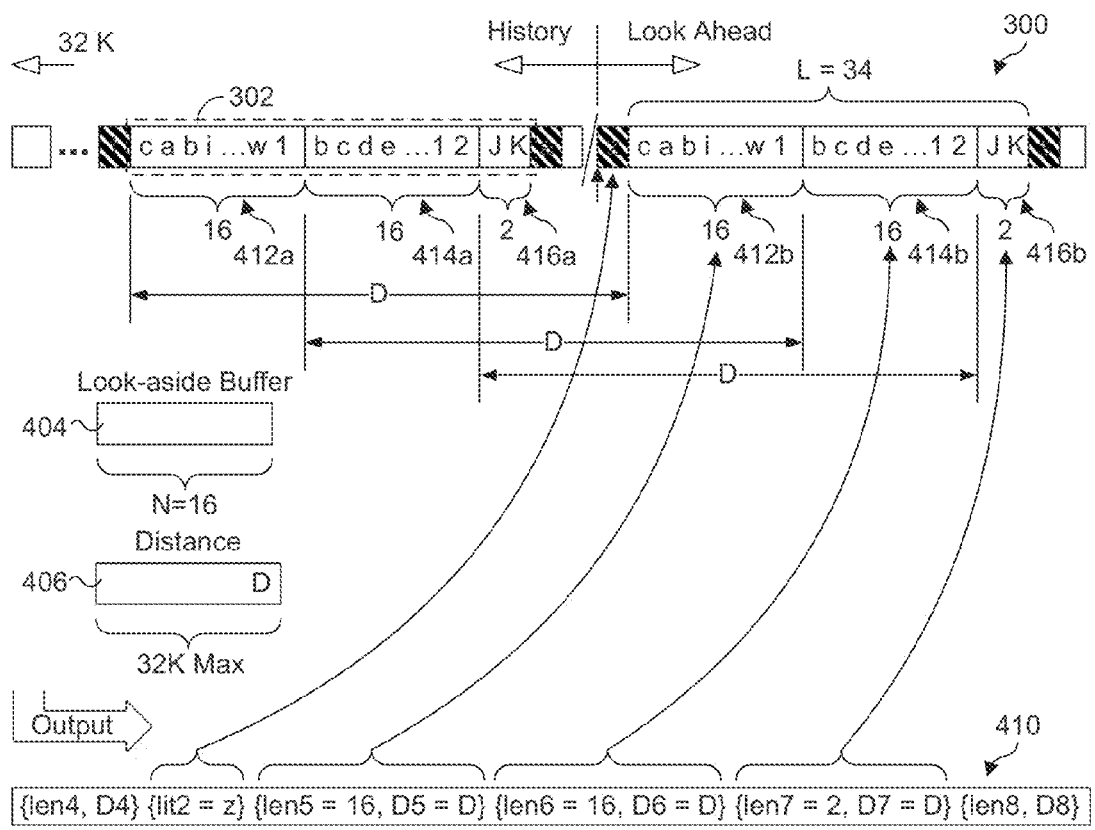
FIG. 4 is a schematic diagram illustrating an LPM front-end matcher employing a look-aside buffer having a shortened length in combination and a distance register, according to one embodiment.

A comparison between the output of a LMP front-end (also referred to herein as a "matcher") using a conventional configuration and one employing a small look-aside buffer having a length of 16 bytes are shown in FIGS. 3 and 4, respectively. Under the conventional approach illustrated in FIG. 3, a look-aside buffer with a length N is used, and thus LPM searches may be implemented such that a LPM string match having a maximum length M that is equal to N may be returned. For example, when used for LMP front-end operations under DEFLATE. N and M=258 bytes. FIG. 3 also depicts the use of a distance register 106 configured to store a maximum distance value of 32K bytes in accordance with the DEFLATE specification. However, this value is merely exemplary, as various other values for a maximum distance may be implemented for different matchers. As further shown in FIG. 3, a byte stream 300 including a set of LPM matched strings 302a and 302b having a length L and separated by a distance D is illustrated. The value of L for matched strings 302a and 302b is 34 bytes. Toward the bottom of FIG. 3 is an exemplary matcher token output stream 310, including a sequence of {len, distance} and {literal} tokens. Matcher token output stream 310 depicts a literal encoding for the literal 'z' as {lit 2=z} and a {len, distance} token for the LPM matched strings 302a and 302b as {len5=34, D5=D} for illustrative purposes. The actual token contents for the literal 'z' and the matched string would be {z} and {34, D}.

FIG. 4 depicts a similar LPM front-end match scheme as that shown in FIG. 3; but employs a look-aside buffer 404 having a shortened length of N=16 bytes rather than a longer value for N, such as 258 bytes. The scheme also uses a distance register 406 that is employed in a similar manner to distance register 106 discussed above. Accordingly, for string matches up to 16 bytes, LPM processing of byte stream 300 yields the same results the conventional approach would produce; however, for string matches having a length of greater than 16, multiple output tokens will be generated, with the first token having a length of 16 and the length of one or more additional tokens being a function of the length of a matching string as a factor of 16. In a more generalized form, for an matching string of original length len_orig at a distance D and an LPM front-end with a maximum match search length of N, a token for a len_orig>N will be encoded as int (len_orig/N) tokens plus an additional token having a length equal to the remainder, with the distance value for each token equal to D.

As example of this is detailed in FIG. 4. As before, there is a matching string in byte stream 300 having a length of 34 bytes at a distance D. However, rather than encoding a corresponding token as {34, D}, three tokens are encoded: {16, D} {16, D}, {2, D} in the output matcher token stream 410. This also would be the normal result obtained by the conventional LPM front-end scheme when a maximum string match length of M=16 is used.

Under aspects of the teachings disclosed herein, a matcher token stream using a shortened length look-aside buffer can be coalesced so as to convert it into an equivalent matcher token stream that would be produced with a longer look-aside buffer. For example, a matcher token stream corresponding to that produced under the conventional DEFLATE LPM front-end approach could be generated by performing a token coalescing operation on a matcher token string using a look-aside buffer with a length that is much shorter than 258 byte conventional maximum matching string length.

In one embodiment, the foregoing token coalescing operation may be implemented using a new entry buffer and a coalesce buffer (CB) and employing the following pseudo-code logic.

```
If (new entry == <len, distance>) {
    If (CB is empty) enqueue(new entry)
    Else {
        If (prev_entry.dist == distance &&
        (prev_entry. len + len)<= MAXLEN) prev_entry.len
        += len;
        Else {
            retire prev_entry via Huffman coder
            enqueue (new entry)
        }
    }
} else {
    If (CB is not empty) {
        retire prev_entry via Huffman coder
    }
    retire new entry via Huffman coder
}
```

Figure 5:
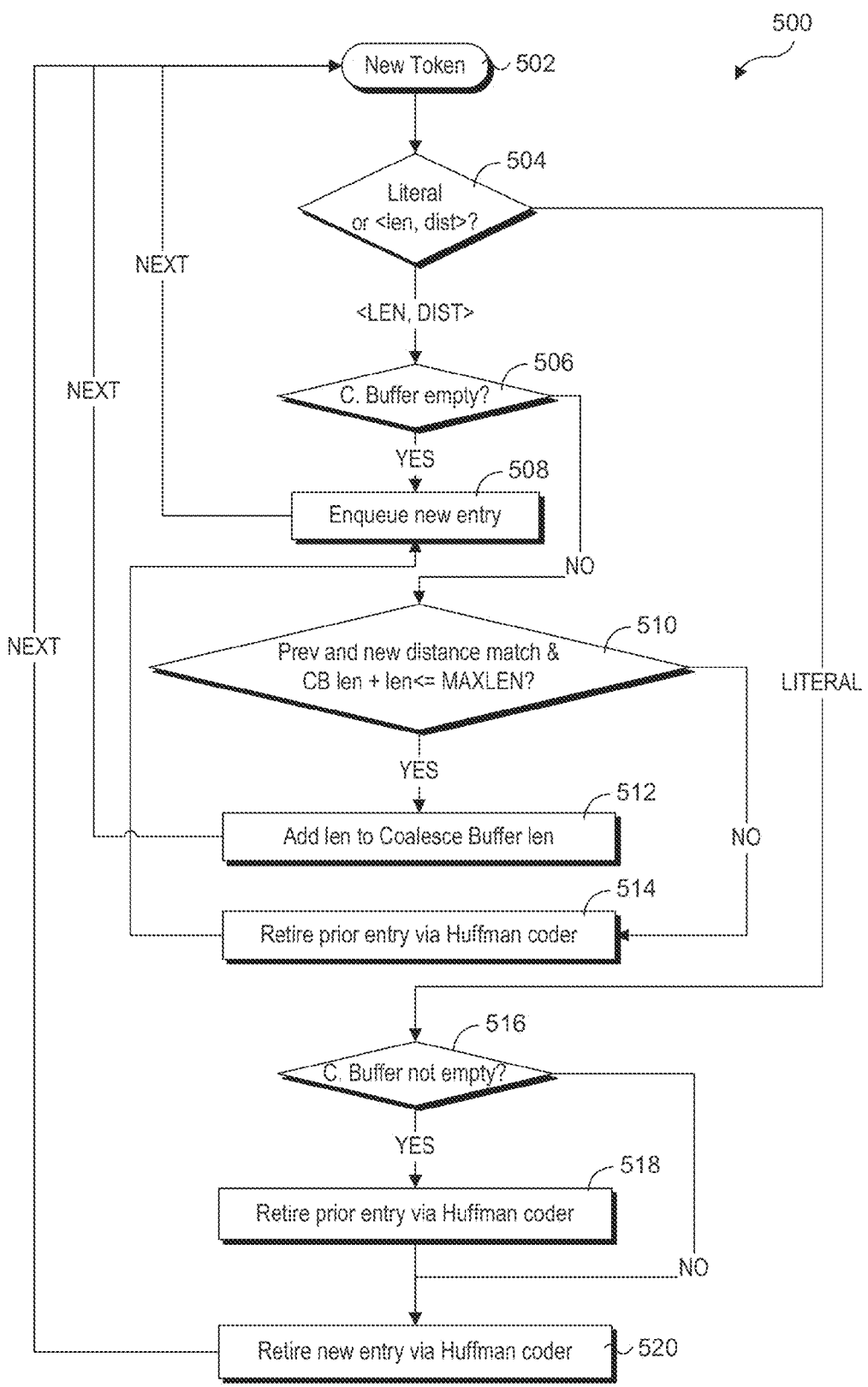
FIG. 5 is a flowchart illustrated operations and logic for performing the token coalescing scheme with delayed matching in accordance with the configuration of FIG. 6 and pseudo-code example in the specification.
Figure 6:
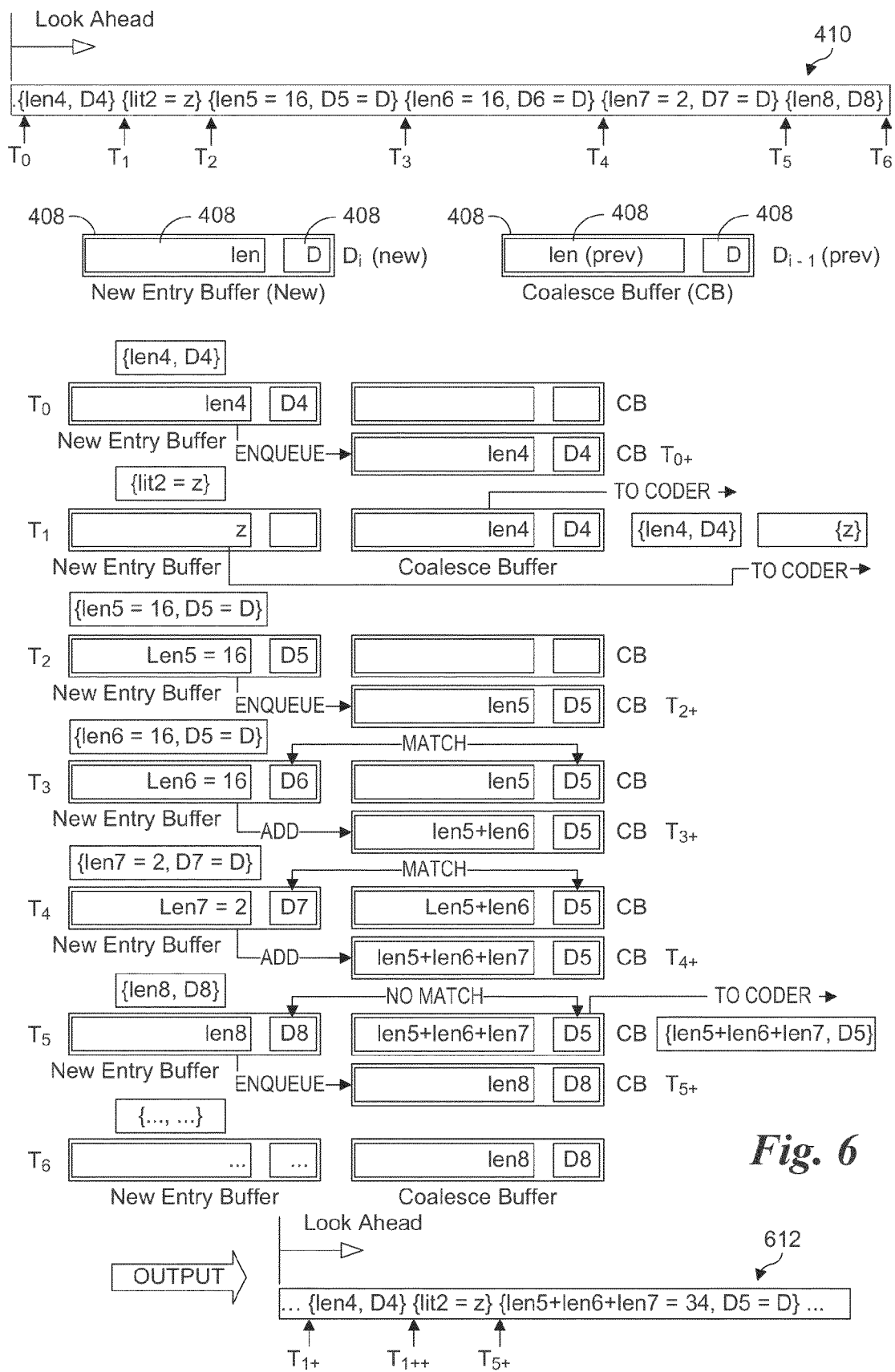
FIG. 6 is a combined schematic and time-flow diagram illustrating a token coalescing scheme employing a new entry buffer and a coalesce buffer, according to one embodiment.

Corresponding operations and logic for implementing this token coalescing functionality are depicted in a flowchart 500 of FIG. 5, and the timeline diagram of FIG. 6.

In further detail, FIG. 6 illustrates one embodiment of a token coalescing scheme employing a new entry buffer 600 and a coalesce buffer 602. As a matcher token stream such as token stream 410 is processed (also referred to as an original token stream), the length (len) and distance values for a given token are loaded into a len register 604 and a distance register 606. In the case of a token comprising a literal, the literal may be loaded into len register 604, with the distance register left empty, which will provide the processing logic with an indication that the data in new entry buffer 600 corresponds to a literal rather than a <len, distance> token pair. Similarly, coalesce buffer 602 includes a previous len register 608 and a distance register 610.

FIG. 6 further depicts the various data held in new entry buffer 600 and coalesce buffer 602 during processing an input original token stream 410 (which is the same token stream output by the LMP front-end matcher of FIG. 4). The various states of the processing of token stream 410 are depicted as times $T_n$. In general, the operations depicted at a given time $T_n$ corresponds to operations that would be performed during a proximate time period, and the illustration of various operations depicted at $T_n$ are not meant to be interpreted such that these operations are performed at a given singular point in time. In general, some operations may be performed concurrently or with partial overlap, while other operations may be performed in a sequential order with optional ordering.

With reference to flowchart 500 of FIG. 5 and the time-flow diagram of FIG. 6, the processing of original token stream 410 begins at time $T_0$ with the processing of a new token {len4, D4}. As shown by a start block 502 labeled "New Token" in flowchart 500, the processing of each new token commences with a determination in a decision block 504 to whether the token contains a literal or a <len, distance> pair. In this instance, {len4, D4} is a <len, distance> pair, and the logic proceeds to a decision block 506 in which a determination is made to whether coalesce buffer 602 is empty. In the example illustrated, prior processing operations (not shown) have resulted in coalesce buffer 602 being empty at time $T_0$, so the answer to decision block 506 is YES, and the new entry data is enqueued to coalesce buffer 602 in accordance with the enqueue new entry operation depicted in a block 508. This operation is depicted in FIG. 6 at a time time $T_{0+}$, with the "+" indicating the operation is performed after the new token is input into new entry buffer 600. Processing then returns to start block 502 to process the next token.

The next token, {lit2=z} (which would actually be encoded as simply {z}), corresponds to a literal. Accordingly, the logic would proceed along the LITERAL branch from decision block 504 to a decision block 516 in which a determination is made to whether coalesce buffer 602 is empty. Since the coalesce buffer contains data corresponding to the previous entry {len4, D4}, this entry is "retired" (i.e., forwarded) to a Huffman coder in a block 518, and then the literal is retired to the Huffman coder in a block 520. These operations result in the replication of the original tokens {len4, D4} {z} in an output coalesced token stream 612 depicted at the bottom of FIG. 6, and the process returns to start block 502.

The processing of the next token {len5=16, D5=D} (which would be encoded as {16, D}) is similar to the previously described for token {len4, D4}, resulting in the token len and distance values being input to new entry buffer 600 at time $T_2$ and enqueued into coalesced buffer 602 at time $T_2$.

The next token {len6=16, D6=D} (which would be encoded as {16, D}) shares the same distance value as the previous token (D5=D6=D). As discussed above, this is indicative of an actual string match that is longer than the maximum string match length that is detected using the shorted max_match_len used by the LPM front-end matcher. As a result, the len values of the tokens are to be coalesced, while preserving the distance value. The corresponding flowchart 500 logic is as follows. The answer to decision block 504 causes the <LEN, DIST> branch to be taken to decision block 506, which outputs a NO because the coalesce buffer holds the previous token len, distance values. A determination is made in a decision block 510 to whether the previous entry distance and new distance match (YES), which is logically ANDed with a determination to whether the coalesce buffer len value added to the new entry len value would exceed the MAXLEN (maximum possible length of encoded string match) defined for the implementation of the compression algorithm. As discussed above, for DEFLATE this value is 258. In this instance, coalesce buffer len+new entry len=32, so the answer to decision block 510 is YES, and the new entry len is added to the existing len value in the coalesce buffer, as depicted by a block 512 and at time $T_3$. Meanwhile, the distance value D5 is maintained in coalesce buffer 602. This effectively coalesces the lens values of the two tokens, indicating a string match condition of {32, D5}; however, this is not forwarded to the Huffman coder at this point, as it is possible that a longer match was present in the original byte stream processed by the LPM front-end.

The next token {len7=2, D7=D} (which would be encoded as {2, D}) has a distance value that matches the previous token. More particularly, it also matches the distance from two tokens prior, but this consideration is automatically handled by the coalescing scheme. As with the previous token, the len value of the new entry is added to the existing len value in coalesce buffer 602, as depicted at time time $T_{4+}$, resulting in a temporally stored value of {34, D}.

The next token {len8, D8} has a distance that does not match the distance of its previous token. This indicates that the string len in this token corresponds to the beginning of a new string match and is not to be coalesced with the existing len value in the coalesce buffer. At the same time, this also means that the existing values in the coalesce buffer are to be retired and forwarded to the Huffman coder as a new token comprising a coalesced len value.

The operations and logic for performing these operations in accordance with flowchart 500 are as follows. The <LEN, DIST> branch is taken from decision block 504, and the answers to decision block 506 and 510 are both NO. In particular, the previous and new distances do not match. This causes the data in coalesce buffer 602 to be output as a token with a coalesced len and forwarded to the Huffman coder, as shown in a block 514. The logic then proceeds to block 508 in which the new entry is enqueued in coalesce buffer 602, as depicted at time $T_{5+}$. Subsequent processing is performed on remaining tokens (not shown) in token stream 410 until the end of the token stream is reached.

The result of the foregoing processing is that string lens corresponding to adjacent tokens having the same distance values are coalesced, thus generating coalesced tokens, while sequentially adjacent tokens that have dissimilar distances and/or encode literals are essentially passed through in their original form. This generates a token stream having the same content as the matcher token stream generated using the conventional look-aside buffer length scheme for substantially all string match conditions, depending on the particular implementation.

For a DEFLATE implementation, there are a few corner cases where the results of the coalesced token output under the foregoing scheme will differ from the conventional approach by a small amount. These result from situations in which an LPM string match condition exists in the original byte stream data that is greater than MAXLEN. For example, for DEFLATE if the original byte stream has a string match with a length greater than 258 bytes, that string match will not be detected since the longest string search will be MAXLEN (i.e., 258). The corresponding tokens for this string match condition will be encoded as {258, D} {string_len−258, D} (presuming the LPM string match is less than 516). For instance, let's say there is a string match with a length of 270 bytes. Under the conventional approach, this will be encoded as {258, D} {12, D}. Under a shortened max_match_len of 16 bytes, this will be originally encoded as 16 tokens of {16, D} followed by a token {14, D}, and thus the coalesced token output will be {256, D} {14, D}. Although these results are different, any corresponding reduction in compression resulting from this difference would be insignificant.

If it is desired to avoid the foregoing corner cases, additional logic may be implemented to encode coalesced tokens of {258, D}, and {257, D} (in some instances). In one embodiment, a check for a maximum multiple of the shortened max_match_len that is less than 258 is detected, and then if following token has a matching distance and a len that if coalesced with the token in the coalesce buffer would exceed 258, it is split such that the first coalesce token is encoded as {258, D}, with the following token being shortened based on how much was added to reach 258. For example, if the max_match_len is 16, the maximum multiple of 16 that is less than 258 is 256. Thus, once a coalesced length of 256 is detected, the logic would shorten the following token len value by 2 if its distance matched, creating a first coalesced token of {258, D} and a following token of {Original len−2, D}.

In the foregoing example with a match length of 270 bytes, the coalesced tokens would be encoded as {258, D} {12, D}, or exactly the same as using the conventional DEFLATE approach. It is noted that {257, D} would never be encoded using a max_match_len of 16 since the minimum len for DEFLATE is 3. However, if a different max_match_len value was used such that it maximum multiple less than 258 was not 256, a coalesced string of {257, D} could be generated. For example, if a max_match_len of 24 is used, the closest multiple of 24 to 258 is 240, and thus 10 tokens of {24, D} followed by a token {17, D} would be encoded as a coalesced token {257, D}.

Another aspect of processing original bitstreams and derived tokens is generating a compressed bitstream by writing tokens (derived from earlier processing operations, such as Huffman coding) to memory. The conventional way to write tokens consisting of a variable number of bits into a bitstream is to use a register as a bit-accumulator, and then when it fills, write it out to memory. This avoids having to do RMW (READ Memory WRITE) operations on memory, which is slow.

The problem with this conventional approach is that there is a branch in the instruction flow in the processor pipeline to check for the register being full, which is relatively unpredictable. For example, if the accumulator register is 64 bits wide, and the tokens average 13 bits in length, then the branch is taken roughly 20% of the time, but in a manner that is not predictable by hardware. On modern "big core" processors, the pipeline is very deep, and the penalty for a branch mispredict can be quite high.

In accordance with aspects of embodiments disclosed herein, a novel approach to writing tokens into bitstreams is provided that avoids the branch operation and associated branch mispredicts. In one embodiment, the basic premise is to always write the accumulator register to memory (or to cache, as applicable), rather than only when the accumulator is full or projected to be full. In another embodiment, the accumulator, maximum token match length, and memory segment size are configured such that the accumulator is written to memory every $n^{th}$ cycle in a manner that guarantees the accumulator will never fill while advancing the memory write address to store a contiguous bitstream in memory. Both of these approaches result in a stream of writes (but not reads) to memory, a portion of which are "extra" and not needed. However, if the data buffer is cacheable, these extra writes are relatively inexpensive. Even if the writes are non-temporal, a write-combining hardware buffer might end up merging some of the redundant writes together. The tradeoff with the conventional approach is that more work is performed for token writes, but the extra processing time resulting from branch mispredicts is eliminated. This new approach has been observed to improve performance during simulation testing.

The following respective sets of pseudo-code respectively illustrates logic for implementing one version of the conventional approach and the new approach. It is noted that the code listing for the conventional approach is illustrative of various logic that might be used on an implementation of one example of the conventional approach, while noting all of the implementations of the conventional approach would include some conditional branch.

| | Listing 1 - Conventional Approach |
|---|---|
| 1. | Input: code, len |
| 2. | bits = bits | (code << bit_count) |
| 3. | bit_count = bit_count + len |
| 4. | if (bit_count >= 64) |
| 5. | *outbuf = bits |
| 6. | outbuf = outbuf + 8 |
| 7. | bit_count = bit_count − 64 |
| 8. | bits = code >> (len − bit_count) |
| | Listing 2 - New Approach |
| 1. | Input: code, len |
| 2. | bits = bits | (code << bit_count) |
| 3. | *outbuf = bits |
| 4. | Tmp = bit_count / 8 |
| 5. | outbuf = outbuf + tmp |
| 6. | tmp = tmp * 8 |
| 7. | bit_count = bit_count − tmp |
| 8. | bits = code >> tmp |

In the conventional approach, the bit accumulator is only written to memory when the accumulator is full or almost full. In the new approach, the bit accumulator is always written for each cycle. Following a write, the various pointers and the bit accumulator are adjusted based on the number of bytes written (i.e. the bit_count/8).

The key points to this approach are:

There are no conditional branches

Each memory write is in general overlapping earlier writes, and in some cases may be to the exact address of previous writes The adjustments to addresses/counts/bit-accumulator may be 0 (i.e. nops) when a short token is written.

Note that the above code performs writes to unaligned addresses. A variation, if the maximum token size is <=32 bits, is to change the divisor/multiplicand from 8 to 32, and do a 32-bit write. This would result in all of the 32-bit writes being to aligned 32-bit addresses (assuming that the first 32-bit write started aligned on a 32-bit address, and the bit accumulator is at least 64 bits wide).

Figure 7A:
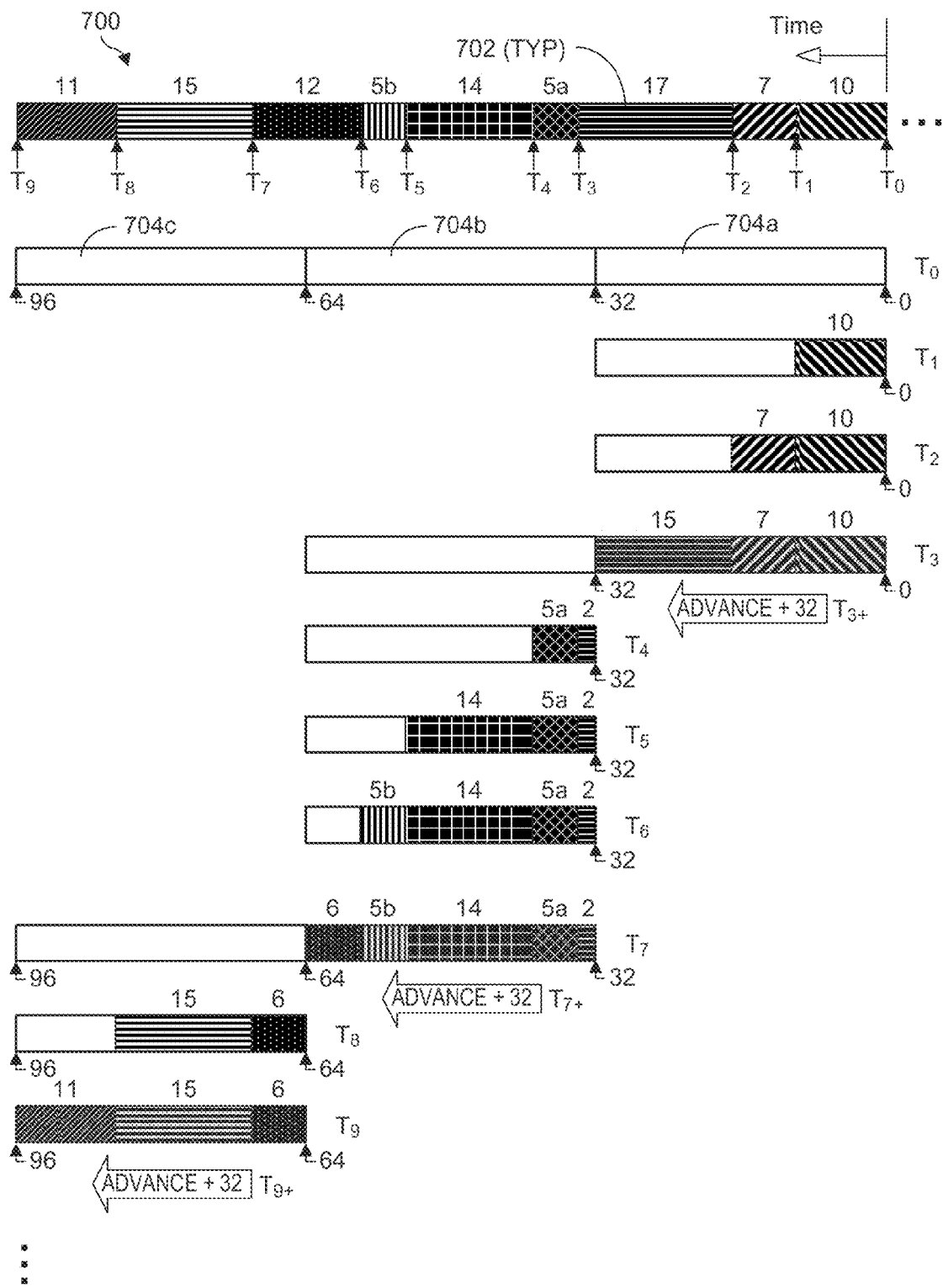
FIGS. 7a and 7b are combined schematic diagram and time-flow diagrams illustrating a scheme for writing variable-length tokens into a bitstream under which token data is entered into a bit accumulator and is written to memory as each token is processed.
Figure 7B:
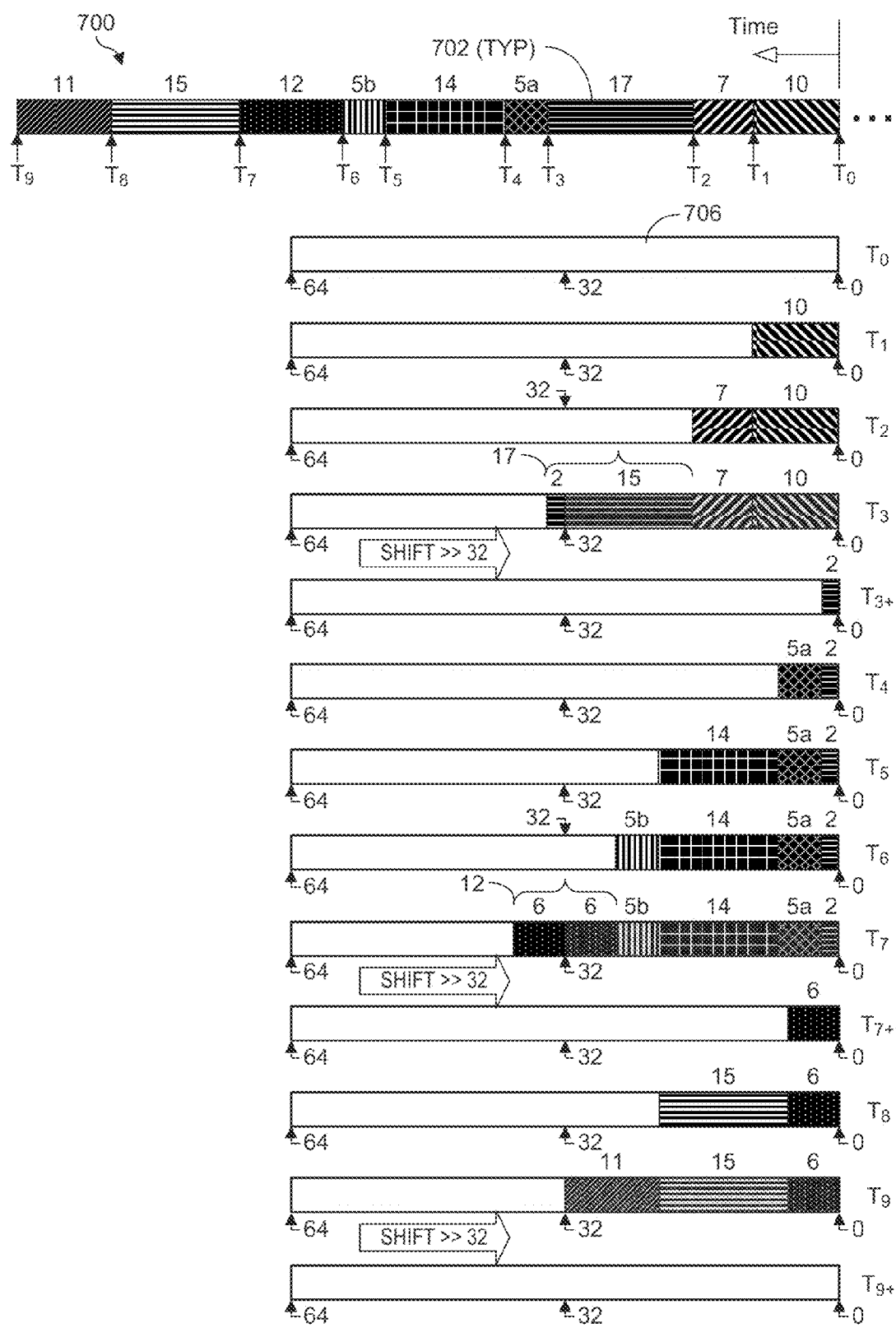

FIGS. 7a and 7b illustrate an exemplary embodiment for writing tokens into bitstreams employing 32-bit writes on aligned 32-bit addresses. A token stream 700 of tokens 702 is depicted as being processed with the front end of a sliding pointer (not shown) moving to the left, beginning at a time $T_0$ and being processed through a time $T_9$. It will be understood that the difference between time instances is variable, and the subscripts used to indicate the time instances are only used to depict the order in which the processing is performed. The length of each token 702 is depicted above the token, and each token is depicted to have a unique crosshatch pattern to distinguish the token from other tokens. For convenience, the tokens will be referred to by their respective lengths rather than a separate reference number (in the case of tokens 5a and 5b, they each have a length of 5). During the processing of token stream 700, token data is loaded into a 64-bit bit accumulator 706 (data states of which are shown in FIG. 7*b*) and written into a portion of memory and/or cache comprising three 32-bit memory segments 704*a*, 704*b*, and 704*c*, beginning at respective addresses 0, 32, and 64, as shown in FIG. 7*a*. FIG. 7*a* illustrates the content in memory segments 704*a*, 704*b*, and 704*c* for each time $T_n$, while FIG. 7*b* illustrates the content in bit accumulator 706 for each time $T_n$.

The processing begins at time $T_0$, at which point memory segments 704*a*, 704*b*, and 704*c* are empty, or otherwise contain existing data that is to be overwritten. During the time period from time $T_0$ to $T_1$, 10 bits of data corresponding to token 10 are loaded into bit accumulator 706 and written to memory segment 704*a* at memory address 0 as a 32-bit write, meaning the least 32-bits in bit accumulator 706 are always written to memory with each 32-bit write. The remaining 22 bits, which are depicted as blank data, contain garbage (i.e., data that is irrelevant). In accordance with Listing 2 above, the bit_count value that points to the bit write position in accumulator 706 (i.e., the position at which the next token bits are to be added) is shifted left by the length of token 10, or 10 bits. During the time period from time $T_1$ to $T_2$, 17 bits of data corresponding to tokens 10 and 7 are written to memory segment 704*a* at memory address 0, along with the remaining 15 MSBs comprising garbage. This effectively adds token 7 data to the token 10 data that existed at time $T_1$; however during the operation both of the token 7 and token 10 data (as well as the remaining 15 MSB of garbage data) is written to memory such that the previous 32 bits in memory segment 704*a*, including the 10 bits of token 10 data, are overwritten. It is noted that a write of data to a memory segment always involves a write of applicable data to the memory segment at the address for the memory segment such that existing data will be overwritten.

During each cycle, code is executed to advance the address pointer (to the applicable memory segment address) by floor (bit_count/mem_seg_size) to update the address pointer for the next accumulator write operation. For example, in the embodiment illustrated in FIGS. 7*a* and 7*b* where the maximum token size was 32, the memory segment size is 32, and the bit accumulator is 64-bits wide, then the result of this division (actually implemented as a shift) will be either be 0 or 1, and then the address pointer will be advanced by either 0 bytes (if bit_count<mem_seg_size) or 1*mem_seg_size (e.g., 32 bits) (if bit_count>=mem_seg_size)). Thus, for conditions in which bit accumulator 706 stores less than 32 bits of token data, the address pointer will not be advanced (essentially a no-op), the contents of the memory segment will be overwritten with the 32 LSBs of the accumulator data.

When the amount of token data in the bit accumulator reaches or exceeds the mem_seg_size, a sequence of operations is performed. First, the mem_seg_size LSBs of the accumulator are written to the memory segment at the current address pointer value. The address pointer is then advanced by mem_seg_size, and now points to the adjacent memory segment. Also, the bit accumulator is shifted by mem_seg_size to flush the mem_seg_size LSBs from the accumulator. (It is noted that the ordering of these last two operations is irrelevant and may be reversed or performed concurrently.) In embodiments employing smaller mem_seg_size, such as 16-bits or 8 bits, it is possible to have the address pointer advance 0, 1, or more than 1 times the mem_seg_size, depending on the mem_seg_size, the bit accumulator size and/or maximum token len, and the applicable logic employed.

An example of these operations are illustrated during the next time period from time $T_2$ to $T_3$, wherein token 17 data is added to tokens 10 and 7 data in bit accumulator 706 resulting in bit accumulator 706 holding 34 bits of data. As before, the 32 LSBs of the bit accumulator are written to memory segment 704*a* at memory address 0. However, now bit_count (34)>=32, causing the address pointer to be advanced by 4 bytes. The data in bit accumulator 706 is then shifted 32-bits to the right, thus flushing the 32 LSBs out of the bit accumulator. These operations are depicted in FIG. 7*b* as time $T_{3+}$, to indicate the shift operation follows the write to memory. The remaining two most significant bits of token 17 remain stored in bit accumulator 706.

The process continues in a manner similar to that above through the time period beginning at time $T_3$ extending through time $T_7$. Except now the token data in accumulator 706 are written as 32-bit writes to memory segment 704*b* at address 32. As illustrated, the data for tokens 5a, 14, 5b, and 12 are effectively respectively added to memory segment 704*b* during successive time periods, which each write cycle overwriting the prior data in memory segment 704*b*. This leads us to time period between time $T_6$ and $T_7$ during which the processing of token 12 is performed. As shown, this results in the 6 LSBs of token 12 (along with the 2 MSBs of token 17, 5 bits of token 5a, 14 bits of token 14, and 5 bits of token 5b) being written to memory segment 704*b*, the memory address pointer being advanced by 4 bytes to point to memory segment address 64, and the 6 MSBs of token 12 remaining in bit accumulator 706 after it is shifted right 32 bits, as shown at time $T_{7+}$ in FIG. 7*b*.

As shown towards the bottom of FIGS. 7*a* and 7*b*, during the time period from time $T_7$ to $T_8$ data corresponding to the 6 MSBs of token 12 and token 15 are written to memory segment 704C and memory address 64. Similarly, during the time period from time $T_8$ to $T_9$ data corresponding to the 6 MSBs of token 12, token 15, and token 11 are written to memory segment 704C and memory address 64. This fills out the 32-bit of memory segment 704*c*, causing the write memory address pointer to advance another 32 bits to a memory address 96, and bit accumulator 706 shifted 32-bits at time $T_{9+}$ in FIG. 7*b*. Processing of portions of token stream 700 going forward (not shown) would proceed in a similar manner.

The process illustrated in FIGS. 7*a* and 7*b* could be implemented with shorter or longer memory segments, such as 8 bit, 16 bit, 64, 128 bit, etc. In accordance with other embodiments, an application wishing to write a series of tokens consisting of an arbitrary small number of bytes could be implemented in a similar manner to that illustrated in FIGS. 7*a* and 7*b* and described above, since this can be viewed as just a special case of writing bits, where the number of bits is always a multiple of 8. Moreover, if the tokens always consisted of an integral number of bytes, the code could be further simplified.

If the memory buffer is cacheable, then the "multiple memory writes" translate into cache writes, which can be handled efficiently. If the writes are done non-temporally, then in many cases, if the writes are being generated too rapidly, then a write-combining hardware buffer will coalesce them into fewer writes. However, even under this circumstance the savings in processor cycles due to the elimination of branch mispredicts results in enhanced performance.

If the output buffer is not cacheable, and there is no write-combining buffer, and the application is such that the writes are generating too much memory bandwidth, then this can be addressed by writing instead to a small (one or two 64 byte cacheline) cacheable buffer. When this buffer fills up, a conditional branch causes it to be copied to the non-cacheable real buffer. This reintroduces the conditional, but in this case it only is taken every 64-128 bytes of output, rather than every 4-8 bytes of output. This means that it can be predicted accurately, and the mispredict happens much less often.

Another approach is to configure the size of the bit accumulator, maximum token match length, and memory segment size such that the accumulator is written to memory every $n^{th}$ cycle in a manner that guarantees the accumulator will never fill while advancing the memory write address to store a contiguous bitstream in memory. For example, under the forgoing example, if the bit accumulator was 64 bits, the memory segment size was 32 bits, and the maximum token size was 16 bits or less, you could perform the accumulator to memory write every $2^{nd}$ cycle and guarantee that the accumulator would never overflow and memory writes and memory advances are performed such that the bitstream would be written to a contiguous block of memory. (It is noted that in this example the bit accumulator width would only need to be at least 47 bits.) This scheme would work in a similar manner if the memory segment size was 64 bits, the maximum token size was 32 bits or less, and the accumulator was at least 95 bits.

Various aspects of the foregoing embodiments may be combined in some implementations. For example, aspects of token coalescing and efficient bitstream writing may be implemented in a bitstream compressor. Accordingly, it may be advantageous to employ logic that matches the maximum token length output by an entropy encoder used to the implementation to the memory segment size that is used (or otherwise limit the maximum token length to a value that is less than the memory segment size).

In general, aspects of the embodiments described herein may be implemented via programmed logic, via software executing on a general purpose or specific purpose processor, or any combination of the two. For example, logic for implementing various aspects of corresponding operations could be implemented using programmed logic in an application specific integrated circuit (ASIC) or a field programmable gate array (FPGA), or various other types of embedded circuitry. All or a portion of the logic could be implemented via software executing on various types of general purpose or special purpose processors such as single-core and multi-core processors, Systems on a Chip (SoCs), network processors, and other types of embedded processors. Additionally, software comprising virtual machine language, byte code, interpreted language, etc., could be implemented on a virtual machine running on a general purpose or special purpose processor.

Thus, embodiments of this invention may be used as or to support a software program or set of software modules or components executed upon some form of processing core (such as the CPU of a computer) or a virtual machine or otherwise implemented or realized upon or within a machine-readable medium. A machine-readable medium includes any mechanism for storing or transmitting information in a form readable by a machine (e.g., a computer). For example, a machine-readable medium may include a read only memory (ROM); a random access memory (RAM); a magnetic disk storage media; an optical storage media; and a flash memory device, etc.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the drawings. Rather, the scope of the invention is to be determined entirely by the following claims, which are to be construed in accordance with established doctrines of claim interpretation.

What is claimed is:

1. A method, comprising:
receiving an original token stream comprising a plurality of original tokens generated by a sliding-window string match search scheme, the original tokens including tokens comprising original len and distance data;
processing the original token stream to generate a coalesced token stream in which a portion of the original tokens are replaced with coalesced tokens including coalesced len and distance data, the processing of the original token stream including,
receiving a first original token having data comprising a first len and a first distance;
receiving a second original token immediately following the first original token having data comprising a second len and a second distance;
comparing the first distance and the second distance for a match; and in response to a match,
temporally storing coalesced token data in a coalesce buffer comprising a len derived from adding the first len and the second len and a distance equal to the first distance;
receiving a third original token immediately following the second original token having data comprising a third len and a third distance;
comparing the first distance and the third distance for a match; and
in response to the first distance and the third distance not matching, generating a coalesced token from the coalesced token data in the coalesce buffer and adding the coalesced token to a coalesced token data stream.

2. The method of claim 1, further comprising limiting a coalesced len value to a maximum len that may be encoded in a coalesced token.

3. The method of claim 1, further comprising employing the method to generate a compressed byte stream or document in accordance with the DEFLATE compression standard.

4. The method of claim 1, wherein the original token stream includes a plurality of tokens encoded as literals, and the coalesced token includes the same tokens encoded as literals.

5. The method of claim 1, further comprising processing the coalesced token stream with an entropy coder to generate compressed data.

6. The method of claim 1, further comprising:
determining that the first distance and the third distance match; and in response to a match,
temporally storing coalesced token data in the coalesce buffer comprising a len derived from adding the first len, the second len, and the third len and a distance equal to the first distance.

7. A method, comprising:
receiving a first original token having data comprising a first len and a first distance;
receiving a second original token immediately following the first original token having data comprising a second len and a second distance;

comparing the first distance and the second distance for a match; and in response to a match, temporally storing coalesced token data in a coalesce buffer comprising a len derived from adding the first len and the second len and a distance equal to the first distance;

receiving a third original token immediately following the second original token having data comprising a third len and a third distance;

comparing the first distance and the third distance for a match; and in response to the first distance and the third distance not matching, generating a coalesced token from the coalesced token data in the coalesce buffer and adding the coalesced token to a coalesced token data stream; and performing string match detection on data in a bitstream using a sliding window-based search scheme including a maximum matched string length that is searched and outputting a token stream comprising a plurality of tokens, each encoded as len and distance data or literal data;

processing the token stream to generate a coalesced token stream in which a portion of the tokens are replaced with coalesced tokens including coalesced len and distance data; and processing the coalesced token stream with an entropy encoder to generate compressed data comprising a plurality of variable-length tokens.

8. The method of claim 7, wherein the entropy encoder is a Huffman coder and the compressed data is compliant with the DEFLATE compression standard.

9. The method of claim 7, further comprising writing the variable-length tokens to memory by inputting token data corresponding to the tokens into a bit accumulator and writing data in the bit accumulator to memory without employing any conditional branch operations to check if the bit accumulator is full or close to full throughout processing of the compressed data.

10. A method, comprising:
receiving a first original token having data comprising a first len and a first distance;
receiving a second original token immediately following the first original token having data comprising a second len and a second distance;
comparing the first distance and the second distance for a match; and in response to a match,
temporally storing coalesced token data in a coalesce buffer comprising a len derived from adding the first len and the second len and a distance equal to the first distance;
receiving a third original token immediately following the second original token having data comprising a third len and a third distance;
comparing the first distance and the third distance for a match; and
in response to the first distance and the third distance not matching, generating a coalesced token from the coalesced token data in the coalesce buffer and adding the coalesced token to a coalesced token data stream; and
writing variable-length tokens received in the input token stream to a bit stream stored in a plurality of memory segments having a memory segment size by performing a cyclical set of operations for each token that is received, including,
inputting data bits of the token into a bit-accumulator register at a location defined by a bit accumulator pointer; and
writing a portion of data in the bit accumulator into one of a memory segment or a cache to be subsequently written to the memory segment.

11. The method of claim 10, wherein the cyclical set of operations further include updating the location of the bit accumulator pointer based on a prior location of the pointer, the length of the token, and the memory segment size.

12. The method of claim 10, wherein the cyclical set of operations further include performing a memory address advance calculation to determine a memory address of the memory segment to which the portion of data in the bit accumulator is written.

13. The method of claim 10, further comprising writing the portion of the data in the bit accumulator to a cacheable buffer.

14. A method, comprising:
receiving a first original token in an input token stream having data comprising a first len and a first distance;
receiving a second original token immediately following the first original token having data comprising a second len and a second distance;
comparing the first distance and the second distance for a match; and in response to a match, temporally storing coalesced token data in a coalesce buffer comprising a len derived from adding the first len and second len and a distance equal to the first distance;
receiving a third original token immediately following the second original token having data comprising a third len and a third distance;
comparing the first distance and the third distance for a match; and
in response to the first distance and third distance not matching, generating a coalesced token from the coalesced token data in the coalesce buffer and adding the coalesced token to the coalesced token data stream; and
writing variable-length tokens received in the input token stream to a bit stream stored in memory by inputting token data corresponding to the tokens into a bit accumulator and writing data in the bit accumulator to memory without employing any conditional branch operations to check if the accumulator is full or close to full throughout processing of the bit stream.

15. The method of claim 14, further comprising, for a cycle performed to process each variable-length token, inputting token data into the bit accumulator and writing out at least a portion of the contents of the bit accumulator to one of memory or a cache.

16. The method of claim 14, wherein during each cycle the at least a portion of the contents of the bit accumulator are written to a cacheable buffer.

17. A tangible non-transitory machine readable medium embedded with instructions, which when executed by a machine, cause the machine to perform the method steps of:
receiving an original token stream comprising a plurality of original tokens generated by a sliding-window string match search scheme, the original tokens including tokens comprising original len and distance data;
processing the original token stream to generate a coalesced token stream in which a portion of the original tokens are replaced with coalesced tokens including coalesced len and distance data, the processing of the original token stream including,
receiving a first original token having data comprising a first len and a first distance;
receiving a second original token immediately following the first original token having data comprising a second len and a second distance;

comparing the first distance and the second distance for a match; and in response to a match, temporally storing coalesced token data in a coalesce buffer comprising a len derived from adding the first and second lens and a distance equal to the first distance;

receiving a third original token immediately following the second original token having data comprising a third len and a third distance;

comparing the first distance and the third distance for a match; and in response to the first distance and the third distance not matching, generating a coalesced token from the coalesced token data in the coalesce buffer and adding the coalesced token to a coalesced token data stream.

18. The tangible non-transitory machine readable medium of claim 17, wherein the coalesced token stream comprises a token stream in accordance with the DEFLATE compression standard.

* * * * *